United States Patent
Do

(10) Patent No.: US 7,245,176 B2
(45) Date of Patent: Jul. 17, 2007

(54) APPARATUS FOR GENERATING INTERNAL VOLTAGE IN TEST MODE AND ITS METHOD

(75) Inventor: Chang-Ho Do, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 92 days.

(21) Appl. No.: 11/015,503

(22) Filed: Dec. 20, 2004

(65) Prior Publication Data
US 2006/0001478 A1    Jan. 5, 2006

(30) Foreign Application Priority Data
Jun. 30, 2004    (KR)    ............. 10-2004-0049849

(51) Int. Cl.
*H03K 3/01* (2006.01)
*G05F 1/10* (2006.01)
(52) U.S. Cl. ............. 327/536; 327/537; 327/538
(58) Field of Classification Search ............. 327/534, 327/536–539
See application file for complete search history.

(56) References Cited

U.S. PATENT DOCUMENTS

| 4,961,007 A * | 10/1990 | Kumanoya et al. ......... 327/537 |
| 5,072,134 A * | 12/1991 | Min ............. 327/536 |
| 5,159,543 A * | 10/1992 | Yamawaki ............. 363/60 |
| 5,801,987 A * | 9/1998 | Dinh ............. 365/185.18 |
| 5,969,565 A * | 10/1999 | Naganawa ............. 327/536 |
| 6,052,022 A * | 4/2000 | Lee ............. 327/589 |
| 6,275,096 B1 * | 8/2001 | Hsu et al. ............. 327/535 |
| 6,278,316 B1 * | 8/2001 | Tanzawa et al. ............. 327/536 |
| 6,285,622 B1 * | 9/2001 | Haraguchi et al. ............. 365/226 |
| 6,300,839 B1 * | 10/2001 | Bazargan et al. ............. 331/57 |
| 6,507,237 B2 * | 1/2003 | Hsu et al. ............. 327/538 |
| 6,538,936 B2 * | 3/2003 | Tanaka et al. ............. 365/201 |
| 6,552,600 B2 * | 4/2003 | Walimbe et al. ............. 327/536 |
| 6,710,631 B2 | 3/2004 | Keeth et al. |
| 6,853,567 B2 * | 2/2005 | Kwon ............. 363/60 |
| 6,914,473 B2 * | 7/2005 | Hohenwarter ............. 327/535 |
| 2002/0017946 A1 * | 2/2002 | Fujii et al. ............. 327/534 |

FOREIGN PATENT DOCUMENTS

| JP | 410069796 | * 3/1998 |
| KR | 10-069796 | 3/1998 |
| KR | 100262750 | 5/2000 |

* cited by examiner

Primary Examiner—Dinh T. Le
(74) Attorney, Agent, or Firm—Lowe Hauptman & Berner LLP

(57) ABSTRACT

An apparatus for receiving a first supply voltage in order to generate an internal voltage includes a control signal generating block for receiving a control enable signal and a clock signal and generating a pumping control signal having a period determined by one of the control enable signal and the clock signal in response to a test mode signal; and a charge pumping block for converting the first supply voltage into the internal voltage in response to the pumping control signal.

15 Claims, 4 Drawing Sheets

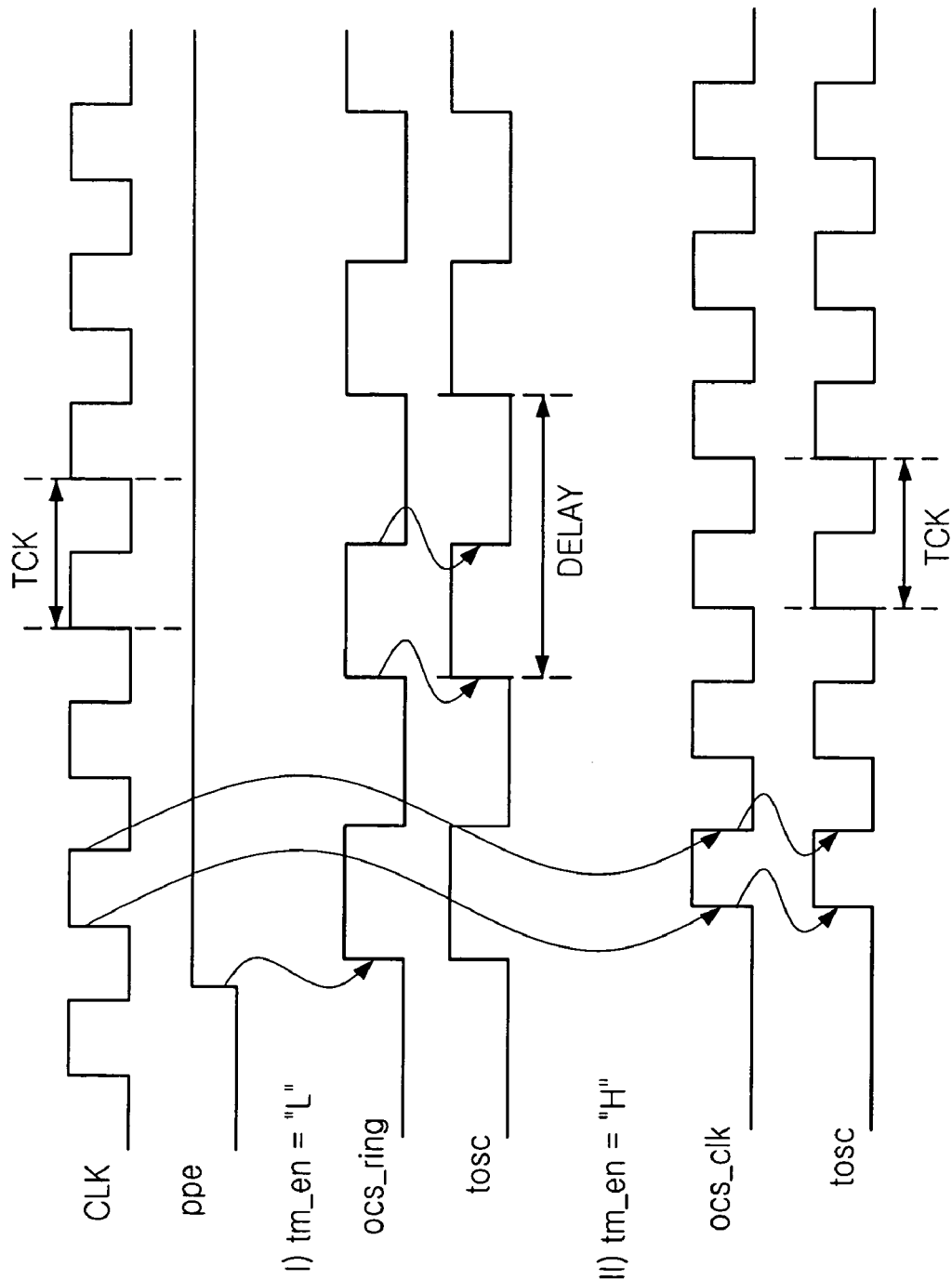

APPARATUS FOR GENERATING INTERNAL VOLTAGE IN TEST MODE AND ITS METHOD

FIELD OF THE INVENTION

The present invention relates to a semiconductor device; and, more particularly, to an apparatus for receiving an supply voltage inputted from an external circuit and generating a low or high internal voltage by repressing or boosting up the supply voltage.

DESCRIPTION OF PRIOR ART

Generally, a semiconductor device is operated under a supply voltage or a low internal voltage. However, in a case of a specific operation performed in the semiconductor device, a high supply voltage (VPP) having a higher voltage level than the supply voltage (VDD) should be inputted to the semiconductor device. For example, when a flash memory device is operated in a program or erase mode, the high supply voltage VPP is inputted to the flash memory device. Also, for increasing an operation speed of a high integrated semiconductor memory device, the high supply voltage VPP is used for activating a word line. The semiconductor memory device includes a high voltage generator for generating the high supply voltage VPP.

Meanwhile, in a semiconductor memory device having a negative word line scheme, a negative supply voltage (VBBW) is supplied for activating or inactivating a word line in the semiconductor memory device. Thus, in the semiconductor memory device, a negative voltage generator for generating the negative supply voltage VBBW is needed.

FIG. 1 is a block diagram showing an internal voltage generator, which is included in a conventional semiconductor device, for generating a high supply voltage VPP or a negative supply voltage VBBW. Hereinafter, the case when the internal voltage generator generates the high supply voltage VPP is described.

As shown, the internal voltage generator includes a voltage level detector 110, a ring oscillator 120 and a charge pump 130.

In detail, the voltage level detector 110 compares a high supply voltage VPP, which is outputted and feed-backed from the charge pump 130, with a reference voltage Vref. Then, the voltage level detector 110 outputs an oscillator enable signal ppe having a logic high level "H" to the ring oscillator 120 if a level of the high supply voltage VPP does not reach on a predetermined voltage level, e.g., a voltage level of the reference voltage Vref. The ring oscillator 120 receives the oscillator enable signal ppe and generates a pumping control signal tosc in response to the oscillator enable signal ppe. If the pumping control signal tosc is activated, the charge pump 130 boosts up a supply voltage VDD to a predetermined voltage level.

Herein, an activation period of the pumping control signal tosc is determined by a delay block included in the ring oscillator 120. Generally, odd number of inverters are included in the delay block. Also, for controlling a delay time of the delay block, the delay block further includes a resistor and a capacitor.

If the high supply voltage VPP reaches on a voltage level of the reference voltage Vref, the oscillator enable signal ppe being a logic high level is outputted from the voltage level detector 110. Then, the ring oscillator 120 is disabled and the charge pump 130 is no more operated.

In the internal voltage generator, a charge amount for pumping the supply voltage to the high supply voltage is based on a capacitance of a pumping capacitor included in the charge pump 130 and an activation period of the pumping control signal tosc. It is desired that an average charge amount for pumping the supply voltage is increased if the capacitance becomes larger. Thus, the high supply voltage VPP outputted from the charge pump 130 is fast boosted up to a predetermined voltage level.

However, a chip size of the semiconductor device becomes larger for increasing the capacitance. In addition, if a period of the ring oscillator is short, the charge for pumping the supply voltage cannot be totally delivered.

Therefore, the semiconductor device should include a ring oscillator for generating a pumping control signal having an appreciate period based on various conditions, e.g., a wire arrangement of the semiconductor device, a manufacturing variance such as a temperature, and so on.

However, the ring oscillator cannot generate a pumping control signal having the appreciate period because it is impossible to apply a lot of various conditions to the semiconductor device. Then, the ring oscillator generally generates the pumping control signal having a period based on an actual measurement. That is, the period of the pumping control signal is determined by a physical condition, e.g., total number of inverters included in the ring oscillator. Herein, it takes a lot of time to perform the actual measurement for setting an accurate period to the pumping control signal generated from the ring oscillator.

Also, since the semiconductor device only use plural delay elements which are already designed and built in order to adjust a period of the pumping control signal, it is very difficult to correct the period of the pumping control signal for reflecting various factors issued in manufacturing steps or an actual operation to the pumping control signal.

As above described, an increase extent of high supply voltage VPP is based on the period of the pumping control signal. In the semiconductor device according to the prior art, there is a limitation to understand variance of the high supply voltage VPP based on a period variance of the pumping control signal since the period of the pumping control signal is determined by a delay value of the ring oscillator.

SUMMARY OF INVENTION

It is, therefore, an object of the present invention to provide a semiconductor device for generating an internal voltage by boosting up a supply voltage in an alterable cycle based on a pumping control signal, wherein a period of a pumping control signal is modifiable.

It is, therefore, another object of the present invention to provide a semiconductor device for adjusting a period of a pumping control signal by using a test mode signal.

It is, therefore, another object of the present invention to provide a semiconductor device for adjusting a period of a pumping control signal based on a period of a clock signal inputted from an external circuit.

It is, therefore, another object of the present invention to provide a semiconductor device for adjusting a period of a pumping control signal based on a period of a clock signal inputted from an external circuit in response to a test mode signal.

In accordance with an aspect of the present invention, there is provided an apparatus for receiving a first supply voltage in order to generate an internal voltage, including a control signal generating block for receiving a control enable signal and a clock signal and generating a pumping control signal having a period determined by one of the control enable signal and the clock signal in response to a test mode signal; and a charge pumping block for converting the first supply voltage into the internal voltage in response to the pumping control signal.

In accordance with another aspect of the present invention, there is provided a method for receiving a first supply voltage in order to generate an internal voltage, including the steps of a) receiving a control enable signal and a clock signal and generating a pumping control signal having a period determined by one of the control enable signal and the clock signal in response to a test mode signal; and b) converting the first supply voltage into the internal voltage in response to the pumping control signal.

BRIEF DESCRIPTION OF DRAWINGS

The above and other objects and features of the present invention will become apparent from the following description of preferred embodiments taken in conjunction with the accompanying drawings, in which:

FIG. 4 is a timing diagram describing an operation of the internal voltage generator according to activation or inactivation of a test mode signal.

DETAILED DESCRIPTION OF THE INVENTION

Hereinafter, a semiconductor device having an apparatus for receiving a first supply voltage in order to generate an internal voltage according to the present invention will be described in detail referring to the accompanying drawings.

Figure 1:
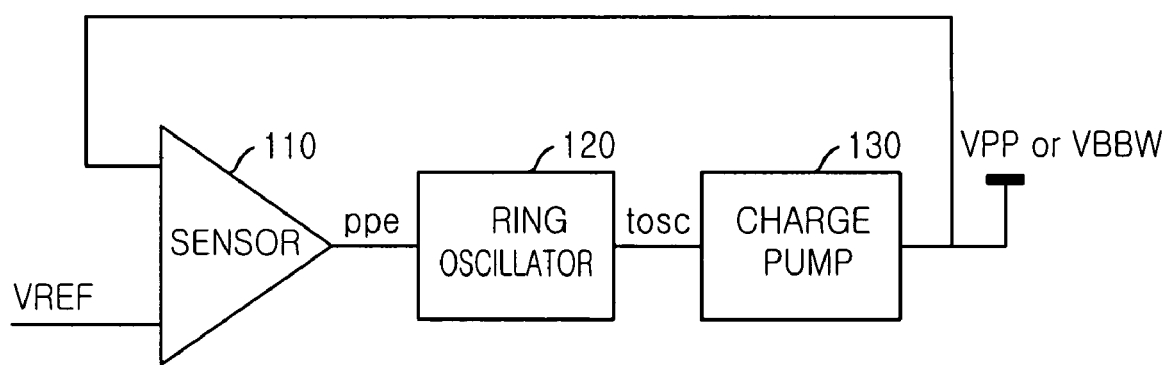
FIG. 1 is a block diagram showing a internal voltage generator included in a conventional semiconductor device.
Figure 2:
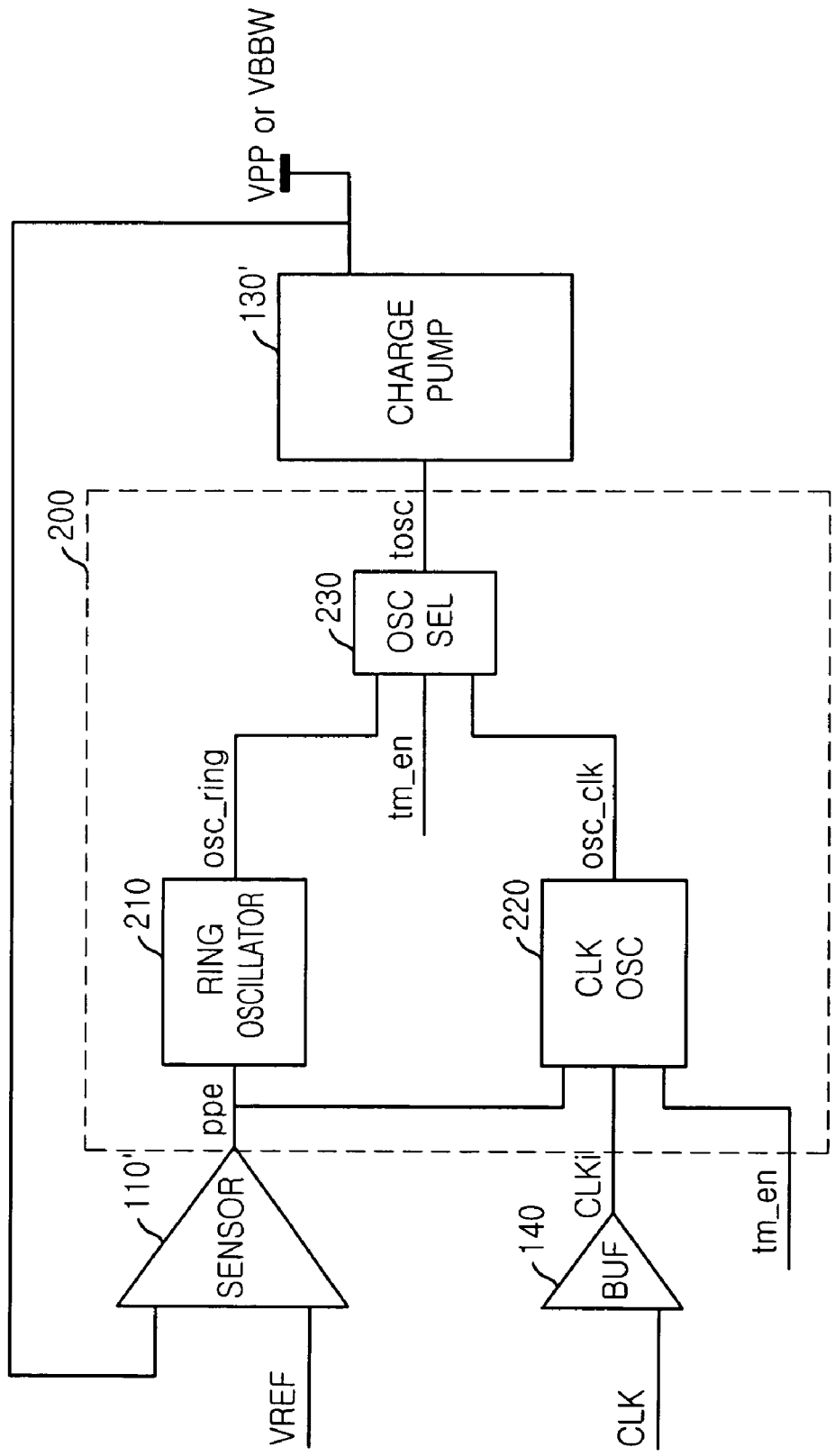
FIG. 2 is a block diagram describing an internal voltage generator included in a semiconductor device in accordance with the present invention.

FIG. 2 is a block diagram describing an internal voltage generator included in a semiconductor device in accordance with the present invention for receiving a first supply voltage in order to generate an internal voltage.

As shown, the internal voltage generator includes a control signal generating block 200 and a charge pumping block 130'.

The control signal generating block 200 receives a control enable signal ppe and an internal clock signal CLKi to generate a pumping control signal tosc. Herein, the pumping control signal tosc has a period determined by one of the control enable signal ppe and the internal clock signal CLKi in response to a test mode signal tm_en and the control enable signal ppe. The test mode signal is inputted from an external circuit for testing a performance of the semiconductor device. The charge pumping block 130' is for converting the first supply voltage into the internal voltage in response to the pumping control signal tosc. The first supply voltage is one of a supply voltage VDD and a ground VSS supplied into the internal voltage generator from an external circuit.

Furthermore, the internal voltage generator includes a comparing block 110' and a buffer 140. The comparing block 110' is for comparing a level of the internal voltage with a level of a reference voltage VREF to thereby generate the control enable signal ppe based on the comparison result.

The buffer 140 receives a clock signal CLK from an external circuit and buffering the clock signal CLK to generate the internal clock signal CLKi.

In detail, the control signal generating block 200 includes a ring oscillator 210, a clock pulse block 220 and a signal selection block 230.

The ring oscillator 210 receives the control enable signal ppe outputted from the comparing block 110' in order to generate a first control signal osc_ring. The clock pulse block 220 receives the internal clock signal CLKi outputted from the buffer 140 for generating a second control signal osc_clk in response to the test mode signal tm_en and the control enable signal. Then, the signal selection block 230 selects one of the first and second control signals osc_ring and osc_clk in response to the test mode signal tm_en in order to output the selected signal as the pumping control signal tosc.

Herein, the internal voltage is a high supply voltage VPP if the first supply voltage inputted to the internal voltage generator is a supply voltage VDD. Otherwise, the internal voltage is a negative supply voltage VBBW if the first supply voltage is a ground VSS.

Figure 3:
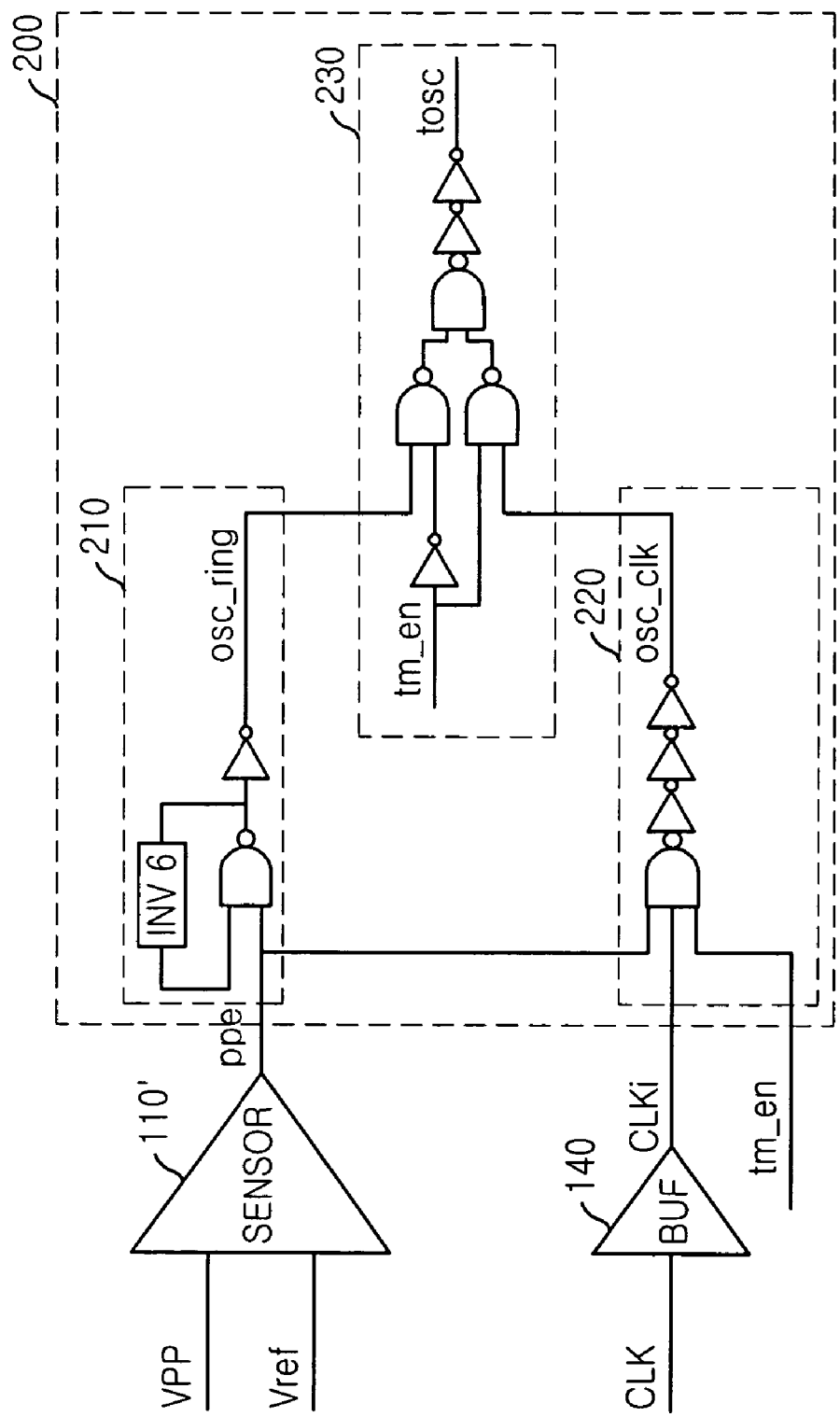
FIG. 3 is a schematic circuit diagram depicting a control signal generating block included in the internal voltage generator shown in FIG. 2.

FIG. 3 is a schematic circuit diagram depicting the control signal generating block 200 included in the internal voltage generator shown in FIG. 2.

As above described, the control signal generating block 200 includes the ring oscillator 210, the clock pulse block 220 and the signal selection block 230.

The ring oscillator 210 for generating the first control signal osc_ring includes a first NAND gate, a delay block INV6 and a first inverter. The first NAND gate is for receiving the control enable signal ppe to generate a first pulse signal. The delay block INV6 having a plural of inverters delays the first pulse signal outputted from the first pulse signal to feedback the first pulse signal to the first NAND gate. Herein, a delay value of the delay block INV6 determines a period of the first control signal osc_ring. Also, the delay block has odd number of inverters, e.g., three inverters. The first inverter is for inverting the first pulse signal outputted from the first NAND gate in order to generate as the first control signal osc_ring.

The clock pulse block 220 for generating the second control signal osc_clk includes a second NAND gate and a plurality of inverters. The second NAND gate receives the internal clock signal CLKi for generating a second pulse signal in response to the test mode signal tm_en and the control enable signal ppe. The plurality of inverters is for inverting the second pulse signal outputted from the second NAND gate to generate as the second control signal osc_clk. That is, there are odd number of inverters.

Lastly, the signal selection block 230 includes plural NAND gates and plural inverters. First, a second inverter is for inverting the test mode signal tm_en. A third NAND gate receives an inverse test mode signal outputted from the second inverter and the first control signal osc_ring in order to output an inverse first control signal in response to the inverse test mode signal. Likewise, a fourth NAND gate is for receiving the test mode signal tm_en and the second control signal and outputting an inverse first control signal in response to the test mode signal tm_en.

Then, a fifth NAND gate receives the inverse first pulse signal and the inverse second pulse signal respectively outputted from the third and fourth NAND gates and performs a logic NAND operation. A third inverter is for inverting an output signal of the fifth NAND gate; and a fourth inverter is for inverting an output signal of the third inverter to output as the pumping control signal tosc.

That is, if the test mode signal tm_en is a logic high level, the signal selection block 230 outputs the second control signal osc_clk outputted from the clock pulse block 220 as the pumping control signal tosc. Otherwise, i.e., if the test mode signal tm_en is a logic low level, the signal selection block 230 outputs the first control signal osc_ring outputted from the ring oscillator 210 as the pumping control signal tosc.

Meanwhile, the control signal generating block 200 can be used for evaluating a performance of a charge pumping block 130'. For example, if various clock signals respectively having different period are inputted to the control signal generating block 200 without the comparing block 110', it is possible to understand a pumping range in response to a period of the pumping control signal tosc.

In addition, for understanding a maximum performance of charge pump operation in the case of continuously carrying out an active precharge operation which consumes a lot of high voltage, a control signal for controlling the active precharge operation is inputted to the clock pulse block 220 instead of the control enable signal ppe.

FIG. 4 is a timing diagram describing an operation of the internal voltage generator according to activation or inactivation of the test mode signal tm_en.

As shown, according to the activation or inactivation of the test mode signal tm_en, the internal voltage generator generates the pumping control signal tosc having different period. If the test mode signal tm$_{13}$en is a logic low level "L", the first control signal osc_ring made by the ring oscillator in response to the control enable signal ppe is outputted as the pumping control signal tosc. Otherwise, if the test mode signal tm_en is a logic high level "H", the second control signal osc_clk based on the clock signal CLK is outputted as the pumping control signal tosc.

According to the present invention, it is unnecessary to design and implement plural internal voltage generators for evaluating a performance of a charge pumping block. Also, for enhancing the performance of the charge pumping block by reflecting various factors issued in manufacturing steps or an actual operation of the charge pumping block, it is easy to correct the period of a pumping control signal which operates the charge pumping block. Thus, time and cost for developing a semiconductor device having the internal voltage generator can be reduced.

The present application contains subject matter related to Korean patent application No. 2004-40849, filed in the Korean Patent Office on Jun. 30, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. An apparatus for receiving a first supply voltage in order to generate an internal voltage, comprising:
    a control signal generating block for receiving a control enable signal and a clock signal and generating a pumping control signal having a period determined by one of the control enable signal and the clock signal in response to a test mode signal;
    a charge pumping block for converting the first supply voltage into the internal voltage in response to the pumping control signal; and
    a comparing block for comparing a level of the internal voltage with a level of a reference voltage and generating the control enable signal based on the comparison result.

2. The apparatus as recited in claim 1, wherein the clock signal is inputted from an external circuit.

3. The apparatus as recited in claim 2, wherein the control signal generating block includes:
    a ring oscillator for receiving the control enable signal to generate a first control signal;
    a clock pulse block for receiving the clock signal to generate a second control signal in response to the test mode signal and the control enable signal; and
    a signal selection block for selecting one of the first and second control signals in response to the test mode signal to output as the pumping control signal.

4. The apparatus as recited in claim 3, wherein the ring oscillator includes:
    a first NAND gate for receiving the control enable signal to generate a first pulse signal;
    a delay block having a plural of inverters for delaying the first pulse signal and feed-backing the first pulse signal to the first NAND gate; and
    a first inverter for inverting the first pulse signal outputted from the first NAND gate to generate as the first control signal.

5. The apparatus as recited in claim 4, wherein the delay block has odd number of inverters.

6. The apparatus as recited in claim 4, wherein the clock pulse block includes:
    a second NAND gate for receiving the clock signal to generate a second pulse signal in response to the test mode signal and the control enable signal; and
    a plurality of inverters for inverting the second pulse signal outputted from the second NAND gate to generate as the second control signal.

7. The apparatus as recited in claim 6, wherein the signal selection block includes:
    a second inverter for inverting the test mode signal;
    a third NAND gate for receiving an inverse test mode signal outputted from the second inverter and the first control signal and outputting an inverse first control signal in response to the inverse test mode signal;
    a fourth NAND gate for receiving the test mode signal and the second control signal and outputting an inverse first control signal in response to the test mode signal;
    a fifth NAND gate for receiving the inverse first control signal and the inverse second control signal and performing a logic NAND operation;
    a third inverter for inverting an output signal of the fifth NAND gate; and
    a fourth inverter for inverting an output signal of the third inverter to output as the pumping control signal.

8. The apparatus as recited in claim 1, wherein the internal voltage is a high supply voltage if the first supply voltage is a supply voltage.

9. The apparatus as recited in claim 1, wherein the internal voltage is a negative supply voltage if the first supply voltage is a ground.

10. A method for receiving a first supply voltage in order to generate an internal voltage, comprising the steps of:
    a) receiving a control enable signal and a clock signal and generating a pumping control signal having a period determined by one of the control enable signal and the clock signal in response to a test mode signal;
    b) converting the first supply voltage into the internal voltage in response to the pumping control signal;

c) comparing a level of the internal voltage with a level of a reference voltage; and d) generating the control enable signal based on the comparison result.

11. The apparatus as recited in claim 10, wherein the step a) includes:

a-1) receiving the control enable signal to generate a first control signal by using a delay block a-2) receiving the clock signal to generate a second control signal in response to the test mode signal and the control enable signal; and a-3) selecting one of the first and second control signals in response to the test mode signal to output as the pumping control signal.

12. The apparatus as recited in claim 11, wherein the clock signal is inputted from an external circuit.

13. The apparatus as recited in claim 12, wherein the delay block has odd number of inverters.

14. The apparatus as recited in claim 10, wherein the internal voltage is a high supply voltage if the first supply voltage is a supply voltage.

15. The apparatus as recited in claim 10, wherein the internal voltage is a negative supply voltage if the first supply voltage is a ground.

* * * * *